United States Patent
Bai et al.

(10) Patent No.: US 9,165,949 B1
(45) Date of Patent: Oct. 20, 2015

(54) ARRAY SUBSTRATE, ITS MANUFACTURING METHOD, AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Jinchao Bai, Beijing (CN); Yao Liu, Beijing (CN); Liangliang Li, Beijing (CN); Xiangqian Ding, Beijing (CN); Zongjie Guo, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/310,826

(22) Filed: Jun. 20, 2014

(30) Foreign Application Priority Data

Apr. 24, 2014 (CN) .......................... 2014 1 0168661

(51) Int. Cl.
*H01L 27/10* (2006.01)
*H01L 27/12* (2006.01)
*H01L 23/522* (2006.01)

(52) U.S. Cl.
CPC .......... *H01L 27/124* (2013.01); *H01L 23/5226* (2013.01); *H01L 27/127* (2013.01)

(58) Field of Classification Search
CPC .. H01L 27/124; H01L 27/127; H01L 23/5226
See application file for complete search history.

(56) References Cited

U.S. PATENT DOCUMENTS

| | | | | |
|---|---|---|---|---|
| 7,118,947 B2* | 10/2006 | Yoo et al. | ...................... | 438/151 |
| 7,132,688 B2* | 11/2006 | Yoo et al. | ......................... | 257/59 |
| 7,397,451 B2* | 7/2008 | Ozawa | ............................. | 345/76 |
| 2005/0092991 A1* | 5/2005 | Ahn et al. | ....................... | 257/59 |
| 2005/0092995 A1* | 5/2005 | Yoo et al. | ....................... | 257/72 |
| 2005/0253978 A1* | 11/2005 | Chae et al. | ...................... | 349/43 |
| 2007/0024793 A1* | 2/2007 | Yoo et al. | ..................... | 349/141 |
| 2012/0001156 A1* | 1/2012 | Cho et al. | ........................ | 257/40 |
| 2013/0075711 A1* | 3/2013 | Kanegae | ........................ | 257/40 |
| 2015/0187307 A1* | 7/2015 | Jin et al. | ......................... | 257/72 |

* cited by examiner

*Primary Examiner* — Allan R Wilson
(74) *Attorney, Agent, or Firm* — Harness, Dickey & Pierce, P.L.C.

(57) ABSTRACT

The present invention provides an array substrate, its manufacturing method, and a display device. The array substrate comprises a gate metal layer, a gate insulating layer, a source/drain metal layer, first common electrode lines arranged on an identical layer to the gate metal layer, a first via hole arranged in the gate insulating layer and corresponding to the first common electrode line, a source/drain metal filling part arranged within the first via hole, a second via hole in communication with the first via hole, and a transparent connection part. The first common electrode lines are, by means of the transparent connection part and the source/drain metal filling part, in electrical connection with each other through the second via hole. According to the present invention, it is able to reduce the depth of the via holes in the array substrate, and improve the uneven diffusion of an alignment layer.

14 Claims, 4 Drawing Sheets

-Prior Art-

-Prior Art-

-Prior Art-

Drew# ARRAY SUBSTRATE, ITS MANUFACTURING METHOD, AND DISPLAY DEVICE

CROSS REFERENCE

The present application claims a priority of the Chinese patent application No. 201410168661.5 filed on Apr. 24, 2014, the disclosures of which are incorporated herein by reference in its entirety.

TECHNICAL FIELD

The present invention relates to the field of display technology, in particular to an array substrate, its manufacturing method, and a display device.

BACKGROUND

Referring to FIG. 1, which is a schematic view showing a thin film transistor array substrate in the prior art, the thin film transistor array substrate comprises common electrodes 102, gate lines 103, common electrode lines 104, and data lines 105. The common electrode lines 104 are connected to the common electrodes 102, so as to reduce the resistance of the common electrodes 102.

A method for manufacturing the thin film transistor array substrate with the above-mentioned structure comprises the following steps:

S11: forming the common electrodes on a substrate;

S12: forming a gate metal layer and the common electrode lines on the substrate with the common electrodes by a one-time patterning process, the gate metal layer including gate electrodes and gate lines;

S13: forming a gate insulating layer on the substrate with the gate metal layer and the common electrode lines;

S14: forming an active layer on the substrate with the gate insulating layer;

S15: forming a source/drain metal layer on the substrate with the active layer, the source/drain metal layer including source/drain electrodes and data lines;

S16: forming a passivation layer (PVX) on the substrate with the source/drain metal layer, and a via hole penetrating through the passivation layer and the gate insulating layer; and S17: forming, on the substrate with the passivation layer, a pixel electrode layer, a first connection part for connecting pixel electrodes to the drain electrodes and a second connection part for connecting the adjacent common electrode lines on the gate metal layer.

Referring to FIG. 2, which is a schematic view showing a connection mode of the common electrode lines on the gate metal layer in the prior art. FIG. 2 includes: the substrate 101, the common electrode lines 104 arranged on an identical layer to the gate metal layer, the gate insulating layer 106, the passivation layer 107, the via holes 108 in the passivation layer, and the second connection part 109 arranged on an identical layer to the pixel electrode layer.

As shown in FIG. 2, the via hole 108 formed in the passivation layer 107 is relatively deep, so a rough surface will occur at the via hole 108, and an alignment layer (PI) will diffuse unevenly, thereby the image quality of a display panel will be affected seriously. For example, such undesirable phenomena as black Mura of the alignment layer at the periphery of the display panel, and M24 defects (with a plurality of vertical, linear Mura, blackening in the middle and whitening at both sides) and white spots (with discontinuous, dot-like black points) within a pixel region, will occur.

Hence, such problems as how to reduce the depth of the via holes in the array substrate and improve the uneven diffusion of the alignment layer urgently need to be addressed.

SUMMARY

An object of embodiments of the present invention is to provide an array substrate, its manufacturing method, and a display device, so as to reduce the depth of via holes in the array substrate and improve the uneven diffusion of an alignment layer.

In one aspect, an embodiment of the present invention provides an array substrate, comprising:
a gate metal layer;
a gate insulating layer;
a source/drain metal layer;
a first common electrode line arranged on an identical layer to the gate metal layer;
a first via hole arranged in the gate insulating layer and corresponding to the first common electrode line;
a source/drain metal filling part arranged within the first via hole;
a second via hole arranged in communication with the first via hole; and
a transparent connection part.

The first common electrode lines are, by means of the transparent connection part and the source/drain metal filling part, in electrical connection with each other through the second via hole.

The array substrate further comprises a passivation layer, in which the second via hole is formed. The first common electrode lines are arranged on an identical layer, and made of an identical material, to the gate metal layer. The source/drain metal filling part is arranged on an identical layer, and made of an identical material, to the source/drain metal layer.

The array substrate further comprises a first transparent conductive layer. The transparent connection part is arranged on an identical layer, and made of an identical material, to the first transparent conductive layer, and the first transparent conductive layer is a pixel electrode layer or a common electrode layer.

The array substrate further comprises a second common electrode line arranged on an identical layer, and made of an identical material, to the source/drain metal layer, and a source/drain metal connection part arranged within the first via hole. The second common electrode line is, by means of the source/drain metal connection part, in electrical connection with the first common electrode line through the first via hole.

In another aspect, an embodiment of the present invention further provides a method for manufacturing an array substrate, comprising:
a step of forming a first common electrode line on a gate metal layer;
a step of forming a first via hole corresponding to the first common electrode line on a gate insulating layer;
a step of forming a source/drain metal filling part within the first via hole;
a step of forming a second via hole in communication with the first via hole; and a step of forming a transparent connection part.

The first common electrode lines are, by means of the transparent connection part and the source/drain metal filling part, in electrical connection with each other through the second via hole.

The first common electrode line is formed together with the gate metal layer by a one-time patterning process. The source/ drain metal filling part is formed together with the source/drain metal layer by a one-time patterning process.

The method further comprises a step of forming a first transparent conductive layer. The transparent connection part is formed together with the first transparent conductive layer by a one-time patterning process.

To be specific, the method comprises:

forming the gate metal layer and a plurality of first common electrode lines on a substrate by a one-time patterning process;

forming the gate insulating layer on the substrate with the gate metal layer and the first common electrode lines, and forming the first via hole corresponding to the first common electrode line on the gate insulating layer;

forming an active layer on the substrate with the gate insulating layer;

forming the source/drain metal layer and the source/drain metal filling part on the substrate with the active layer by a one-time patterning process, the source/drain metal filling part being arranged within the first via hole;

forming a passivation layer on the substrate with the source/drain metal layer and the source/drain metal filling part, and forming the second via hole in communication with the first via hole in the passivation layer; and forming the first transparent conductive layer and the transparent connection part on the substrate with the passivation layer by a one-time patterning process, the first common electrode lines being, by means of the transparent connection part and the source/drain metal filling part, in electrical connection with each other through the second via hole.

The method further comprises a step of forming a second common electrode line and a source/drain metal connection part, the source/drain metal connection part being arranged within the first via hole, and the second common electrode line being, by means of the source/drain metal connection part, in connection with the first common electrode line through the first via hole. The second common electrode line and the source/drain metal connection part are formed together with the source/drain metal layer by a one-time patterning process.

In yet another aspect, an embodiment of the present invention provides a display device comprising the above-mentioned array substrate.

The present invention has the following advantages. The source/drain metal filling part is filled in the via hole above the first common electrode line arranged on the identical layer to the gate metal layer. As a result, it is able to reduce the depth of the via holes above the first common electrode line, thereby to improve the smoothness of the array substrate, the uneven diffusion of an alignment layer, and the display quality.

DETAILED DESCRIPTION

In order to make the objects, the technical solutions and the advantages of the present invention more apparent, the present invention will be described hereinafter in conjunction with the drawings and the embodiments.

An array substrate comprises a gate metal layer, a gate insulating layer, a source/drain metal layer, a first common electrode line arranged on an identical layer to the gate metal layer, a first via hole arranged in the gate insulating layer and corresponding to the first common electrode line, a source/drain metal filling part arranged within the first via hole, a second via hole in communication with the first via hole, and a transparent connection part. The first common electrode lines are, by means of the transparent connection part and the source/drain metal filling part, in electrical connection with each other through the second via hole.

Through the above-mentioned structure, the source/drain metal filling part is filled within the first via hole above the first common electrode line. As a result, it is able to reduce the depth of the via holes (including the first via holes and the second via holes) above the first common electrode line, thereby to improve the smoothness of the array substrate, the uneven diffusion of an alignment layer, and the display quality.

In this embodiment, the gate metal layer includes gate lines and gate electrodes, and the first common electrode line is parallel to the gate line and connected to the common electrode, so as to reduce the resistance thereof. The first common electrode line is arranged on an identical layer, and made of an identical material, to the gate metal layer.

The source/drain metal layer includes source/drain electrodes and data lines, and the source/drain metal filling part may be arranged on an identical layer, and made of an identical material, to the source/drain metal layer.

The array substrate may further comprise a first transparent conductive layer. The transparent connection part may be arranged on an identical layer, and made of an identical material, to the first transparent conductive layer, and the first transparent conductive layer may be a pixel electrode layer or a common electrode layer.

When the array substrate is of an ADS mode, it may further comprise a second transparent conductive layer which may be arranged on an identical layer to the gate metal layer.

Figure 3:
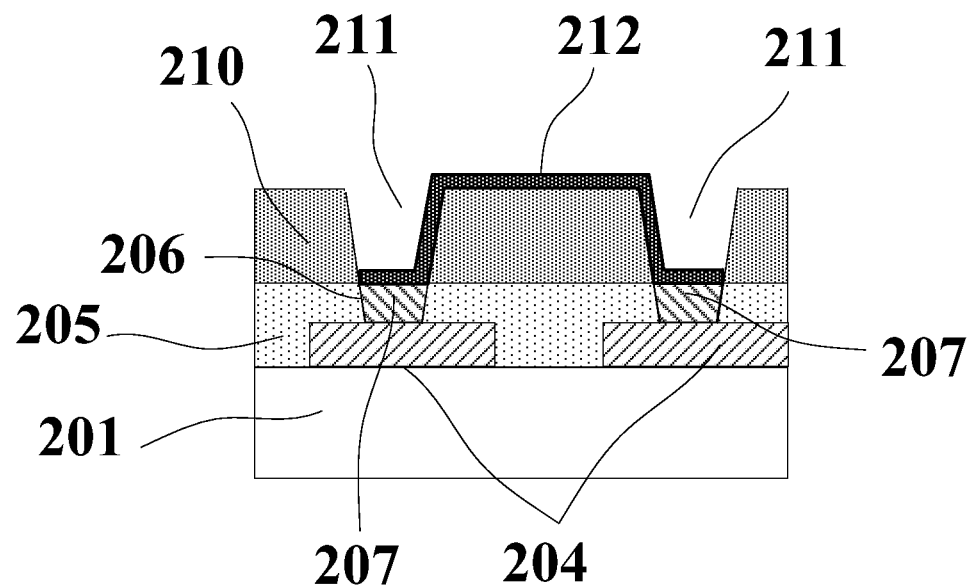
FIG. 3 is a schematic view showing an array substrate according to one embodiment of the present invention.

Referring to FIG. 3, which is a schematic view showing the array substrate according to one embodiment of the present invention, the array substrate comprises a substrate 201, the first common electrode line 204 arranged on an identical layer to the gate metal layer, the gate insulating layer 205, the first via hole 206 arranged in the gate insulating layer 205 and corresponding to the first common electrode line 204, the source/drain metal filling part 207 arranged within the first via hole 206, a passivation layer 201, the second via hole 211 arranged in the passivation layer 210 and in communication with the first via hole 206, and the transparent connection part 212.

The first common electrode lines 204 are, by means of the transparent connection part 212 and the source/drain metal filling part 207, in electrical connection with each other through the second via hole 211.

Figure 1:
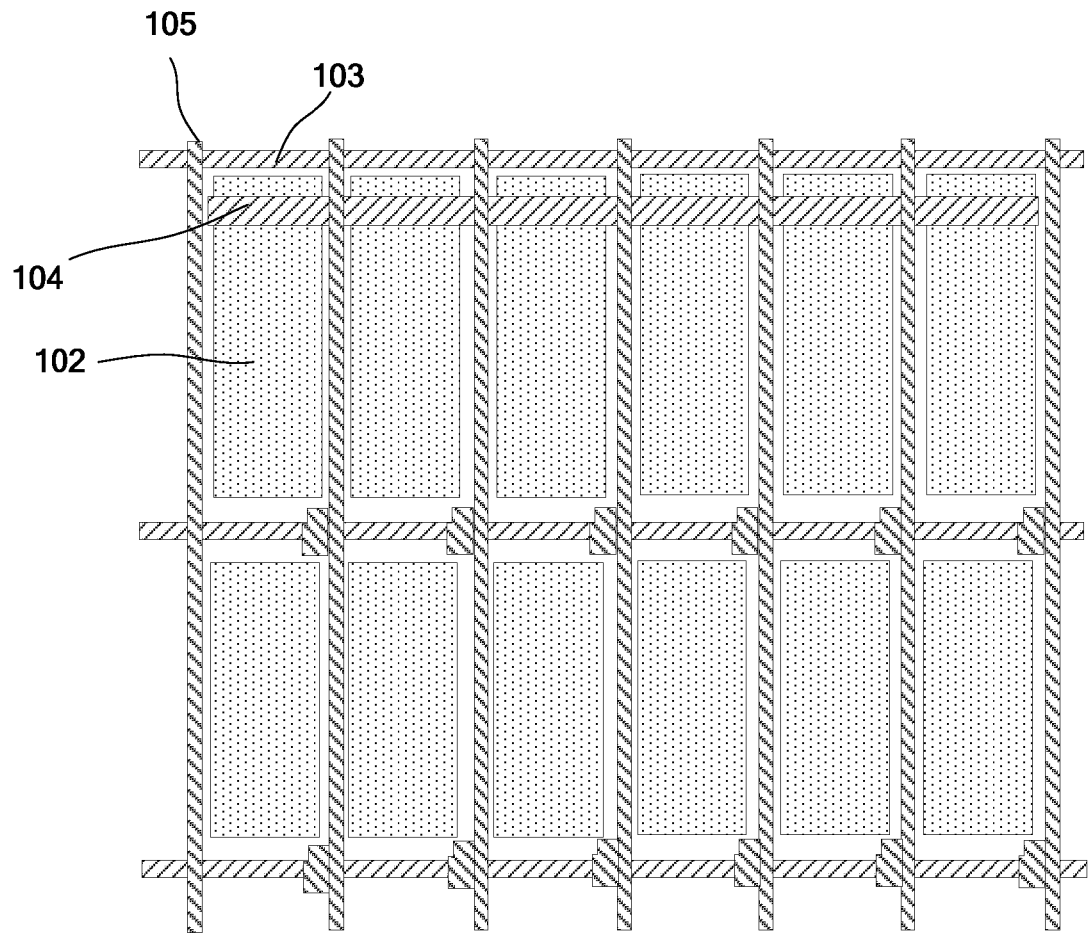
FIG. 1 is a schematic view showing an array substrate in the prior art.
Figure 2:
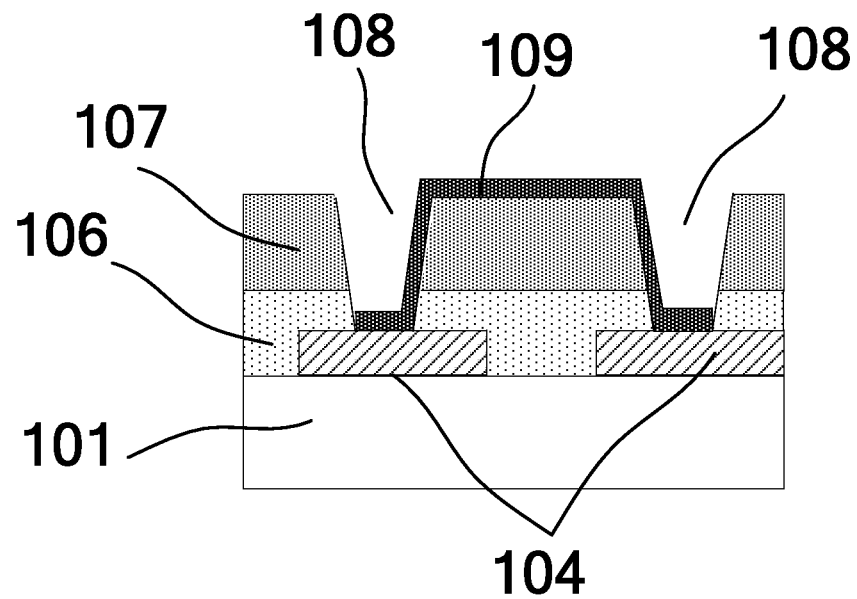
FIG. 2 is a schematic view showing a connection mode of common electrode lines arranged on an identical layer to a gate metal layer in the prior art.

It can therefore be seen that, as compared with the array substrate in FIG. 2, the depth of the via holes above the first common electrode line 204 in FIG. 3 is reduced significantly due to the source/drain metal filling part 207 filled therein.

In this embodiment, the array substrate comprises the common electrode line arranged on an identical layer to the gate metal layer, and the common electrode line are connected to the common electrode, so as to reduce the resistance thereof. In addition, the array substrate may comprise the common electrode line arranged on an identical layer to the source/drain metal layer simultaneously, so it is able to further reduce the resistance of the common electrode.

Figure 4:
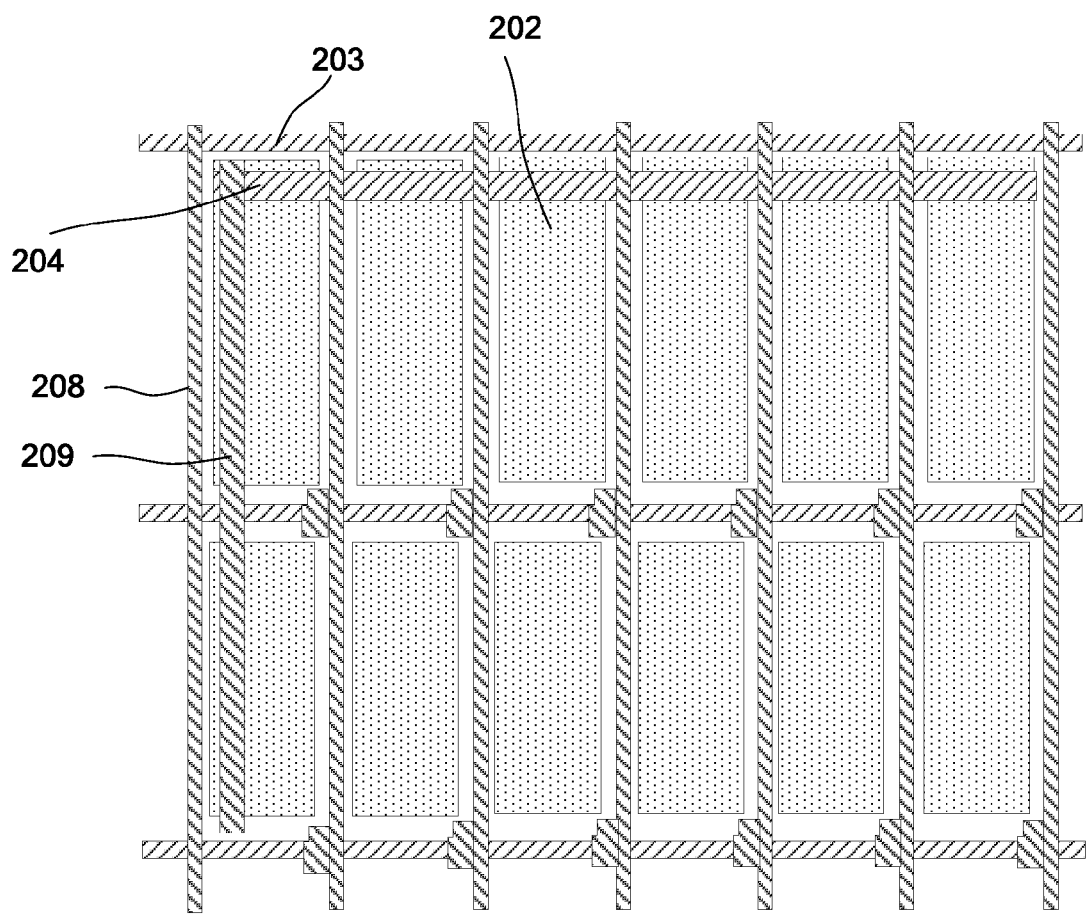
FIG. 4 is another schematic view showing the array substrate according to one embodiment of the present invention.

Referring to FIG. 4, which is another schematic view showing the array substrate according to one embodiment of the present invention, the array substrate comprises the common electrode 202, the gate line 203, the first common electrode line arranged on an identical layer to the gate line 203, the data line 208, and the second common electrode line 209 arranged on an identical layer to the data line 208. The first common electrode line 204 and the second common electrode line 209 are connected to the common electrode, so as to reduce the resistance thereof.

The second common electrode line 209 is parallel to the data line 208, and arranged on an identical layer, and the second common electrode line 209 may be made of an identical material, to the data line 208.

In order to balance the voltage over the common electrode lines, the second common electrode line 209 may be connected to the first common electrode line 204.

Figure 5:
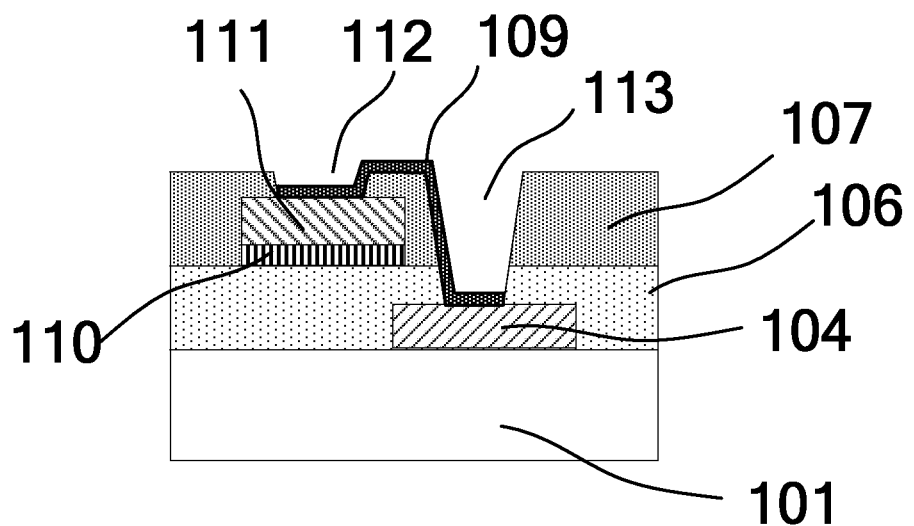
FIG. 5 is a schematic view showing a connection mode of a common electrode line arranged on an identical layer to a gate line and a common electrode line arranged on an identical layer to a data line in the prior art.

Referring to FIG. 5, which is a schematic view showing a connection mode of the common electrode line arranged on an identical layer to the gate line and the common electrode line arranged on an identical layer to the data line. FIG. 5 includes: the substrate 101, the common electrode line 104 arranged on an identical layer to the gate line, the gate insulating layer 106, the active layer 110, the common electrode line 111 arranged on an identical layer to the data line, the passivation layer 107, the via holes 112 and 113 arranged in the passivation layer, and the third connection part 109 on the transparent conductive layer. The common electrode line 104 arranged on an identical layer to the gate line is, by means of the third connection part 109, in electrical connection to the common electrode line 111 arranged on an identical layer to the data line through the via holes 113 and 112 in the passivation layer.

As can be seen from FIG. 5, there exists a problem that the via hole 110 above the common electrode line 104 is also deep.

Figure 6:
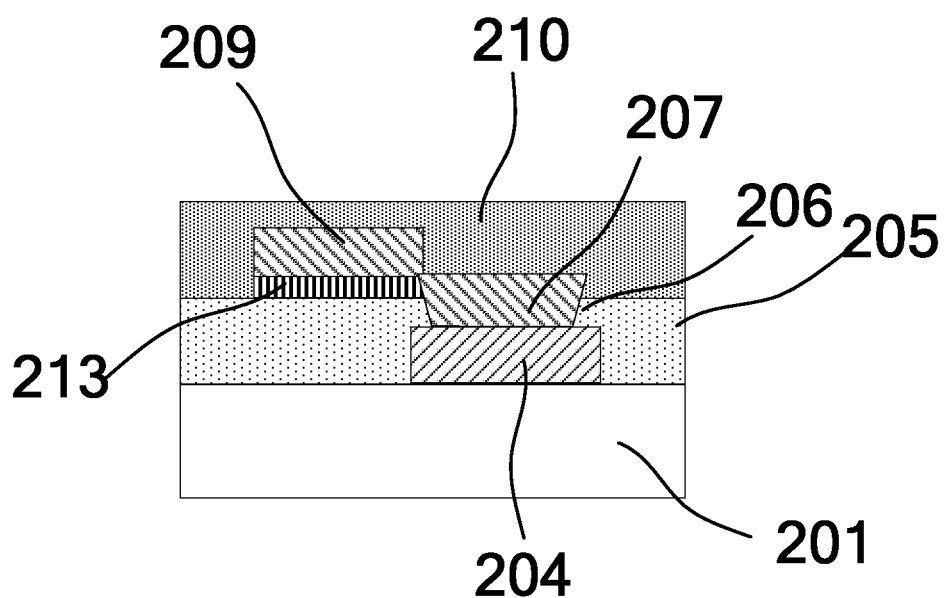
FIG. 6 is a schematic view showing a connection mode of a common electrode line arranged on an identical layer to a gate line and a common electrode line arranged on an identical layer to a data line according to one embodiment of the present invention.

In order to overcome the above problem, referring to FIG. 6, the array substrate may further comprise the source/drain metal connection part 207 arranged within the first via hole. The second common electrode line 209 arranged on an identical layer to the source/drain metal layer may be, by means of the source/drain metal connection part 207, in electrical connection with the first common electrode line 204. In FIG. 6, 213 represents the active layer.

It can therefore be seen that, as compared with the array substrate in FIG. 5, in the array substrate in FIG. 6, it is unnecessary to provide the via hole for connecting the first common electrode line and the second common electrode line after the formation of the passivation layer. As a result, it is able to improve the smoothness of the array substrate, the uneven diffusion of the alignment layer, and the display quality.

The present invention further provides a method for manufacturing an array substrate, comprising:

a step of forming a first common electrode line on a gate metal layer;

a step of forming a first via hole corresponding to the first common electrode line on a gate insulating layer;

a step of forming a source/drain metal filling part within the first via hole;

a step of forming a second via hole in communication with the first via hole; and a step of forming a transparent connection part.

The first common electrode lines are, by means of the transparent connection part and the source/drain metal filling part, in electrical connection with each other through the second via hole.

Through the above-mentioned method, the source/drain metal filling part is filled within the first via hole above the first common electrode line, so as to reduce the depth of the via holes (including the first and second via holes) above the first common electrode line, thereby to improve the smoothness of the array substrate, the uneven diffusion of the alignment layer and the display quality.

Alternatively, the first common electrode line is formed together with the gate metal layer by a one-time patterning process, and the source/drain metal filling part is formed together with the source/drain metal layer by a one-time patterning process.

Alternatively, the method further comprises a step of forming a first transparent conductive layer. The transparent connection part is formed together with the first transparent conductive layer by a one-time patterning process.

The one-time patterning process includes steps of forming a film, applying a photoresist, exposing and developing, etching, and removing the remaining photoresist.

Alternatively, the method comprises the steps of:

S21: forming the gate metal layer and a plurality of first common electrode lines on the substrate by a one-time patterning process, the gate metal layer including the gate lines and the gate electrodes;

S22: forming the gate insulating layer on the substrate with the gate metal layer and the first common electrode line, and forming the first via hole corresponding to the first common electrode line on the gate insulating layer;

S23: forming the active layer on the substrate with the gate insulating layer;

S24: forming the source/drain metal layer and the source/drain metal filling part on the substrate with the active layer by a one-time patterning process, the source/drain metal filling part being arranged within the first via hole, the source/drain metal layer including the data lines, source electrodes and drain electrodes;

S25: forming the passivation layer on the substrate with the source/drain metal layer and the source/drain metal filling part, and forming the second via hole in communication with the first via hole in the passivation layer; and S26: forming the first transparent conductive layer and the transparent connection part on the substrate with the passivation layer by a one-time patterning process, the first common electrode lines being, by means of the transparent connection part and the source/drain metal filling part, in electrical connection with each other through the second via hole.

In an existing method for manufacturing an array substrate, a hole penetrating through a passivation layer and a gate insulating layer is formed after the formation of a passivation layer, and then a second connection part is formed in the hole so as to connect common electrode lines arranged on an identical layer to a gate metal layer, so the hole formed in this method is relatively deep. However, in embodiments of the present invention, the first via hole is provided in the gate insulating layer after the gate insulating layer is formed, and when the source/drain metal layer is formed, the source/drain metal connection part is formed within the first via hole. Then, after the passivation layer is formed, the second via hole in communication with the first via hole is provided in the passivation layer. Because the source/drain metal connection part us filled in the first via hole, the depth of the via holes (including the first and second via holes) above the first common electrode line will be reduced. As a result, it is able to improve the smoothness of the array substrate, the uneven diffusion of the alignment layer and the display quality.

In the above embodiments, the array substrate comprises the first common electrode lines arranged on an identical layer to the gate metal layer, and the first common electrode line is connected to the common electrode, so as to reduce the resistance thereof. In addition, the array substrate may comprise the second common electrode lines arranged on an identical layer to the source/drain metal layer, so as to further the resistance of the common electrode.

In order to balance the voltage over the common electrode lines, the second common electrode line arranged on an identical layer to the source/drain metal layer may be connected to the first common electrode line.

At this time, the method may further comprise a step of forming the second common electrode line and the source/drain metal connection part, the source/drain metal connection part being arranged within the first via hole, and the second common electrode line being, by means of the source/drain metal connection part, in connection with the first common electrode line through the first via hole.

The second common electrode line and the source/drain metal connection part are formed together with the source drain metal layer by a one-time patterning process.

Through the above-mentioned structure, it is unnecessary to provide the via hole for connecting the first common electrode line and the second common electrode line after the formation of the passivation layer. As a result, it is able to improve the smoothness of the array substrate, the uneven diffusion of the alignment layer and the display quality.

In addition, when the array substrate is of an ADS mode, the method may further comprise a step of forming the second transparent conductive layer, and the second transparent conductive layer may be arranged on an identical layer to the gate metal layer.

The present invention further provides a display device comprising the above-mentioned array substrate. The display device may be any product or part having a display function, such as a liquid crystal display panel, an electronic paper, an OLED panel, a mobile phone, a tablet PC, a TV, a display, a laptop PC, a digital photo frame and a navigator.

The above are merely the preferred embodiments of the present invention. It should be appreciated that, a person skilled in the art may make further modifications and improvements, without departing from the principle of the present invention, and these modifications and improvements shall also be considered as the scope of the prevent invention.

What is claimed is:

1. An array substrate, comprising a gate metal layer, a gate insulating layer, and a source/drain metal layer, the array substrate further comprising:
    a plurality of first common electrode lines arranged on an identical layer to the gate metal layer;
    a first via hole arranged in the gate insulating layer and corresponding to the first common electrode line;
    a source/drain metal filling part arranged within the first via hole;
    a second via hole arranged in communication with the first via hole; and
    a transparent connection part,
    wherein the first common electrode lines are, by means of the transparent connection part and the source/drain metal filling part, in electrical connection with each other through the second via hole.

2. The array substrate according to claim 1, further comprising:
    a passivation layer, in which the second via hole is formed.

3. The array substrate according to claim 1, wherein the first common electrode lines are arranged on an identical layer, and made of an identical material, to the gate metal layer.

4. The array substrate according to claim 1, wherein the source/drain metal filling part is arranged on an identical layer, and made of an identical material, to the source/drain metal layer.

5. The array substrate according to claim 1, further comprising:
    a first transparent conductive layer,
    wherein the transparent connection part is arranged on an identical layer, and made of an identical material, to the first transparent conductive layer.

6. The array substrate according to claim 1, further comprising:
    a plurality of second common electrode lines arranged on an identical layer, and made of an identical material, to the source/drain metal layer; and
    a source/drain metal connection part arranged within the first via hole,
    wherein the second common electrode line is, by means of the source/drain metal connection part, in electrical connection with the first common electrode line through the first via hole.

7. A display device comprising the array substrate according to claim 1.

8. The display device according to claim 7, the array substrate further comprising:
    a passivation layer, in which the second via hole is formed.

9. The display device according to claim 7, wherein
    the first common electrode lines are arranged on an identical layer, and made of an identical material, to the gate metal layer.

10. The display device according to claim 7, wherein
    the source/drain metal filling part is arranged on an identical layer, and made of an identical material, to the source/drain metal layer.

11. The display device according to claim 7, the array substrate further comprising:
    a first transparent conductive layer,
    wherein the transparent connection part is arranged on an identical layer, and made of an identical material, to the first transparent conductive layer.

12. The display device according to claim 11, wherein
    the first transparent conductive layer is a pixel electrode layer or a common electrode layer.

13. The display device according to claim 7, the array substrate further comprising:
    a plurality of second common electrode lines arranged on an identical layer, and made of an identical material, to the source/drain metal layer; and
    a source/drain metal connection part arranged within the first via hole, wherein the second common electrode line is, by means of the source/drain metal connection part, in electrical connection with the first common electrode line through the first via hole.

14. The array substrate according to claim 5, wherein the first transparent conductive layer is a pixel electrode layer or a common electrode layer.

\* \* \* \* \*